United States Patent
Scholz

[11] Patent Number: 5,959,497
[45] Date of Patent: Sep. 28, 1999

[54] PROCESS FOR CONTROLLING THE POWER OF THE TRANSMISSION AMPLIFIER OF RADIO EQUIPMENT

[75] Inventor: Matthias Scholz, Goslar, Germany

[73] Assignee: Robert Bosch GmbH, Stuttgart, Germany

[21] Appl. No.: 08/952,370

[22] PCT Filed: Jan. 28, 1997

[86] PCT No.: PCT/DE97/00142

§ 371 Date: Nov. 5, 1997

§ 102(e) Date: Nov. 5, 1997

[87] PCT Pub. No.: WO97/40577

PCT Pub. Date: Oct. 30, 1997

[30] Foreign Application Priority Data

Apr. 20, 1996 [DE] Germany .......................... 196 15 842

[51] Int. Cl.⁶ .............................. H03G 3/30; H03M 1/10
[52] U.S. Cl. ................................ 330/2; 330/129; 341/121
[58] Field of Search ................................... 330/2, 9, 129; 341/119, 120, 121

[56] References Cited

U.S. PATENT DOCUMENTS

| | | | |
|---|---|---|---|
| 4,926,360 | 5/1990 | Spink | 341/120 X |
| 5,194,822 | 3/1993 | Bureau et al. | 330/2 X |
| 5,381,148 | 1/1995 | Mueck et al. | 341/120 X |
| 5,731,772 | 3/1998 | Mikkola et al. | 341/121 X |

OTHER PUBLICATIONS

European Digital Cellular Telecommunications System (Phase 2); Radio Transmission And Reception (GSM 05.05), European Telecommunications Standards Institute, May 1994.

*Primary Examiner*—Steven J. Mottola
*Attorney, Agent, or Firm*—Michael J. Striker

[57] ABSTRACT

In the method for controlling output of a transmission amplifier of a radio, especially of a mobile telephone, by a digital/analog converter, calibration cycles for the digital/analog converter are performed during transmission pauses. Test signals are applied to the digital/analog converter and the signals delivered from the digital/analog converter are compared, after conversion into digital signals, with the test signals. The offset of the D/A converter is determined in a signal evaluation and control unit, and in the following transmission is superimposed on the input signal fed to the digital/analog converter.

6 Claims, 1 Drawing Sheet

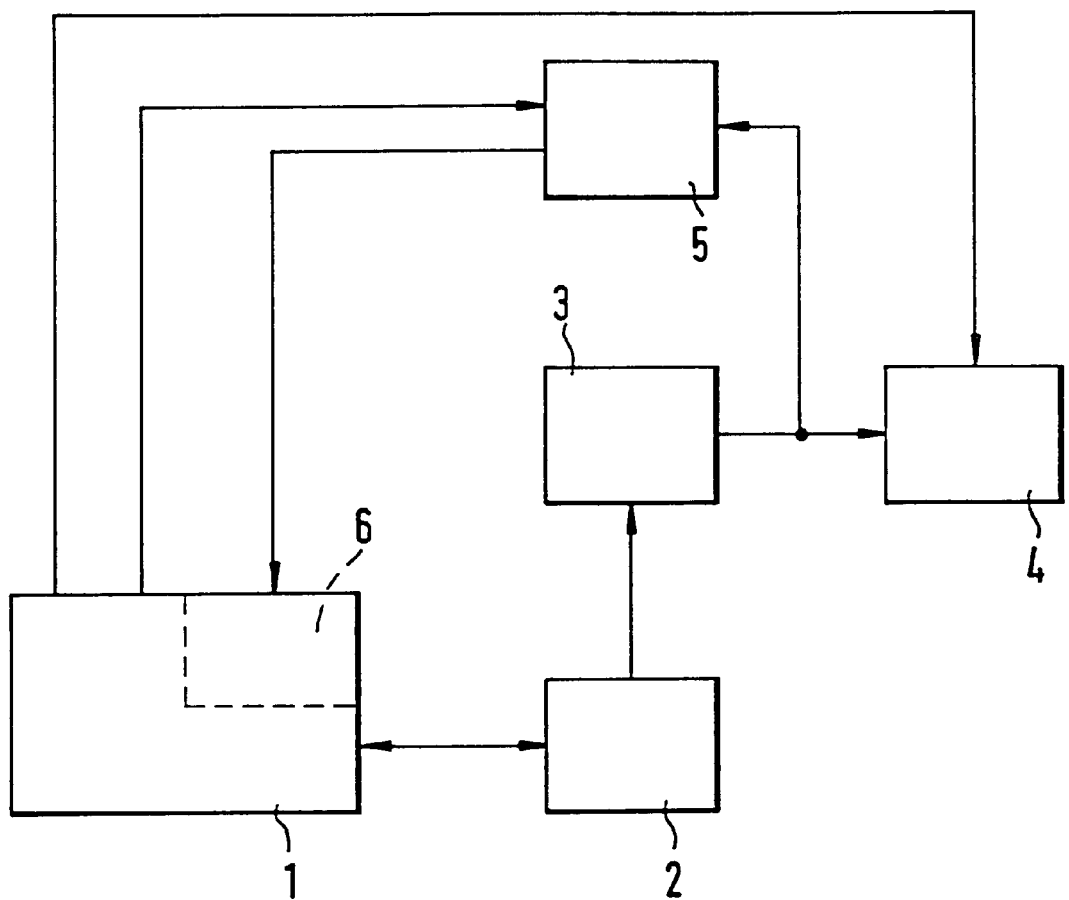

PROCESS FOR CONTROLLING THE POWER OF THE TRANSMISSION AMPLIFIER OF RADIO EQUIPMENT

BACKGROUND OF THE INVENTION

1. Field of the Invention

The invention is based on a method for controlling the output of a transmission amplifier of a radio, in particular the transmission amplifier of a mobile phone, via a digital/analog converter.

2. Prior Art

From "European digital cellular telecommunications system" (Phase 2); Radio transmission and reception (GSM 05.05) of the European Telecommunications Standards Institute of May 1994, it is known that data are transmitted in time-layered multiplexing in mobile phones; that is, that transmission operations take place only during certain time slots, in so-called bursts. The output of the transmission amplifier is raised to the requisite value only for the actual transmission operation, in accordance with a specified time function. Both for the course of a time and for the final value of the transmission output, a narrow tolerance range is prescribed, so that high demands for accuracy and freedom from offset are made of the digital/analog converter by means of which the transmission amplifier output is controlled.

SUMMARY OF THE INVENTION

It is an object of the present invention to provide an improved method for control of the output of a transmission amplifier of a radio, especially a mobile phone, via a digital/analog converter.

It is another object of the present invention to provide an improved method for control of the output of a transmission amplifier of a radio which does not place high demands for accuracy and freedom from offset.

The method of the invention makes it possible by comparison to precisely control the output of the transmission amplifier of a radio device via conventional digital/analog converters, of which no particular demands for freedom from offset are made. This is advantageously attained in that the offset of the digital/analog converter is measured during transmission pauses and taken into account in the ensuing transmission operation as a correction variable in the triggering of the digital/analog converter.

It is also advantageous to amplify the signal, output by the digital/analog converter in transmission pauses in the context of test cycles, before evaluation, so that particularly for low values of the offset high resolution in its determination is achieved. Moreover, as a result adulteration in the determination of the offset from an additional offset of the analog/digital converter for reconversion of the analog signal into a digital signal can be largely ignored.

Finally, it is advantageous if the offsets of the circuit stages involved in ascertaining the offset of the digital/analog converter are known, so that these adulterations can be taken into account in the form of correction values.

If the offset of the digital/analog converter is essentially dependent on the ambient temperature, then the value of the offset can also be used to compensate for the temperature drift of other components.

BRIEF DESCRIPTION OF THE DRAWING

An exemplary embodiment of the invention is shown in the drawing and described in further detail in the ensuing description. The drawing schematically shows a layout for performing the method of the invention; for the sake of simplicity, only the function blocks essential to the invention are shown.

DESCRIPTION OF THE PREFERRED EMBODIMENTS

The method of the invention will be described below taking as an example mobile phones operated by the GSM standard, but in principle it is not limited to this application but instead can be expanded to radio devices in general.

In the exemplary embodiment, shown in the drawing, of a circuit arrangement for performing the method of the invention, an evaluation and control unit 1 is connected to a signal generator 2 via a data line. The signal generator 2 triggers the digital/analog converter 3, whose output signal is delivered on the one hand to the transmission amplifier 4 and on the other to an amplifier 5, which in turn is connected to an analog/digital converter associated with the evaluation and control unit 1. In addition, a control signal for adjusting its gain is delivered to the amplifier 5 by the evaluation and control unit 1. A control signal can also be delivered to the transmission amplifier 4 by the evaluation and control unit 1 with which the triggering of the transmission amplifier 4 by the signal output by the digital/analog converter 3 is suppressed during the test cycles.

The circuit arrangement functions as follows. During the time slots not needed for transmitting data, that is, during the transmission pauses, calibration cycles are performed in order to determine the offset of the digital/analog converter 3, by way of which the transmission amplifier output is controlled. To that end, in a signal generator 2, which can advantageously also be in the form of a program implemented in a microprocessor, test signals are generated in response to a suitable command from the evaluation and control unit 1 and are applied to the digital/analog converter 3. These test signals in the simplest case are quasistatic signals, but other signal forms are also feasible. The output signal of the digital/analog converter 3, which in the transmission mode serves to control the output of the transmission amplifier 4, is converted into a digital signal via an analog/digital converter 6 and delivered to the evaluation and control unit 1. There, the signal in digital form, output by the digital/analog converter 3 after conversion by the analog/digital converter 6, is compared with the digital signal output by the signal generator 2 for triggering the digital/analog converter 3. From the comparison of the two signals, the offset of the digital/analog converter is determined. This offset is additively superimposed as a correction value on the signal for triggering the digital/analog converter 3 in the next transmission operation, thus compensating for the offset of the digital/analog converter.

For the sake of frequency economy and to reduce the energy demand of the mobile phones, it is provided that the transmission output be raised to a predetermined value only during the time slots required for the transmission, and to be reduced during the transmission pauses. To enable achieving the attendant energy-saving effect with the method of the invention as well, it may be provided that the connection between the digital/analog converter 3 and the transmission amplifier 4 be interrupted for the duration of the calibration cycle. This can be accomplished in a simple way by a controllable switch slipped into the connection between the digital/analog converter 3 and the transmission amplifier 4; this switch is opened by the evaluation and control unit 1 at the onset of a calibration cycle and closed again at the onset of a transmission operation.

In a further feature of the invention it is contemplated that the signal output by the digital/analog converter 3 during a transmission pause be amplified, prior to conversion into a digital signal, by an amplifier 5, on the assumption that the amplifier has a low offset. In this way, it is attained that the offset caused by the analog/digital converter 6, which is superimposed on the actual signal to be determined, is negligibly slight. Moreover, at low values of the output signal of the digital/analog converter 3, it is possible to improve the resolution in acquisition and evaluation of the signal, to which end a control signal for adjusting the gain factor can be delivered to the amplifier 5 by the evaluation and control unit 1.

In a further embodiment of the invention it is contemplated that the offset caused by the amplifier 5 is known in the evaluation and control unit 1 and is taken into account in the form of a correction value in determining the offset of the digital/analog converter 3. The situation is similar for the analog/digital converter 6 for converting the output signal of the digital/analog converter 3 into a digital signal. Once again, with knowledge of the offset of the analog/digital converter 6, the signal to be acquired is cleaned by the offset caused by the analog/digital converter.

Finally, a further feature of the invention provides that in the event that the offset of the digital/analog converter 3 is essentially dependent on the ambient temperature, the offset is used as a standard for the temperature, to compensate for the temperature drift of other components.

I claim:

1. A method of controlling output of a transmission amplifier of a radio via a digital/analog converter, said method comprising the steps of:
    a) performing calibration cycles for the digital/analog converter (3) during transmission pauses;
    b) generating digital test signals in a signal generator (2) and applying said test signals to the digital/analog converter (3);
    c) amplifying signals output by said digital/analog converter (3) to form analog amplified signals;
    d) converting said analog amplified signals via an analog/digital converter (6) to form digital amplified signals and feeding said digital amplified signals to an evaluation and control unit (1);
    e) comparing said test signals generated in the signal generator (2) with said digital amplified signals in the evaluation and control unit (1) in order to determine an offset of the digital/analog converter (3); and
    f) during a next transmission following the comparing step e), superimposing said offset upon input signals fed to the digital/analog converter (3).

2. The method as defined in claim 1, wherein said offset is known in said evaluation and control unit (1) and said digital amplified signals fed to said evaluation and control unit (1) are corrected or adjust by said offset conditioned by said amplifier (5).

3. The method as defined in claim 1, wherein said offset is known in said evaluation and control unit (1) and said digital amplified signals fed to said evaluation and control unit (1) are corrected or adjust by said offset of the analog/digital converter (6).

4. The method as defined in claim 1, wherein said test signals are quasi-static signals.

5. The method as defined in claim 1, wherein the radio is a mobile telephone.

6. A method of controlling output of a transmission amplifier of a radio via a digital/analog converter, said method comprising the steps of:
    a) performing calibration cycles for the digital/analog converter (3) during transmission pauses;
    b) generating digital test signals in a signal generator (2) and applying said test signals to the digital/analog converter (3);
    c) converting signals output from the digital/analog converter (3) in step b) by means of an analog/digital converter (6) to form digital signals and feeding said digital signals to an evaluation and control unit (1);
    d) comparing said test signals generated in the signal generator (2) with said digital signals in the evaluation and control unit (1) in order to determine a temperature-dependent offset of the digital/analog converter (3);
    e) during a next transmission following the comparing, superimposing said offset upon input signals fed to the digital/analog converter (3);
    f) correcting said digital signals fed to said evaluation and control unit (1) with said temperature-dependent offset;
    g) using said temperature-dependent offset as a measure of temperature; and
    h) calibrating additional components of said radio using said temperature-dependent offset determined in step d).

* * * * *